United States Patent
Remy De Graffenried

(10) Patent No.: US 6,380,513 B1
(45) Date of Patent: Apr. 30, 2002

(54) METHOD FOR FIXING MINIATURIZED COMPONENTS ONTO A BASE PLATE BY SOLDERING

(75) Inventor: Christian Remy De Graffenried, La Tour-de-Peilz (CH)

(73) Assignees: Leica Geosystems AG, Heerbrugg; MTA Automation AG, Brugg/Beil, both of (CH)

( * ) Notice: Subject to any disclaimer, the term of this patent is extended or adjusted under 35 U.S.C. 154(b) by 0 days.

(21) Appl. No.: 09/554,685
(22) PCT Filed: Nov. 19, 1998
(86) PCT No.: PCT/EP98/07432
  § 371 Date: Oct. 13, 2000
  § 102(e) Date: Oct. 13, 2000
(87) PCT Pub. No.: WO99/26754
  PCT Pub. Date: Jun. 3, 1999

(30) Foreign Application Priority Data

Nov. 20, 1997 (DE) .......................... 197 51 352

(51) Int. Cl.[7] .............................. B23K 26/20
(52) U.S. Cl. .............. 219/121.85; 219/121.66; 219/85.12; 29/832
(58) Field of Search ........ 219/121.85, 121.65, 219/121.66, 85.12, 121.64, 121.63; 29/840, 832; 228/6.2, 180.22, 234.1

(56) References Cited

U.S. PATENT DOCUMENTS

| | | | |
|---|---|---|---|
| 3,764,772 A | | 10/1973 | Matuschek |
| 5,644,837 A | * | 7/1997 | Fathi et al. |
| 5,829,125 A | * | 11/1998 | Fujimoto et al. |
| 6,284,998 B1 | * | 9/2001 | Sinkunas et al. |
| 6,298,075 B1 | * | 10/2001 | Kitaoka et al. |

FOREIGN PATENT DOCUMENTS

EP   0 577 589   1/1994

\* cited by examiner

*Primary Examiner*—Tom Dunn
*Assistant Examiner*—Jonathan Johnson
(74) *Attorney, Agent, or Firm*—Rothwell, Figg, Ernst & Manbeck p.c.

(57) ABSTRACT

A process for fastening a miniaturized component (2), in particular assembled in a modular manner, on a baseplate (1) by a solder joint is described. A side (4) of the component (2) is coated with a layer (5) of solder material, and the baseplate (1) is at least partly coated with a layer of metal (6, 6', 6"). The component (2) is arranged above the baseplate (1), the metal layer and the layer (5) of solder material being a vertical distance apart and not in contact with one another. Heat energy is then supplied from the side of the baseplate (1) for melting solder material of the layer (5) of solder material on the side (4) of the component (2) until a drop forms, with the result that the drop (5') of solder material fills the space between the component (2) and the baseplate (1) for mutual fastening.

16 Claims, 2 Drawing Sheets

METHOD FOR FIXING MINIATURIZED COMPONENTS ONTO A BASE PLATE BY SOLDERING

The present invention relates to a process for fastening a miniaturized component, in particular assembled in a modular manner, on a baseplate by a solder joint.

DE-A-195 33 426 describes a mechanical fastening system for microoptical elements, assembled in a modular manner, preferably in a housing, on a baseplate for the production of an optical or optoelectronic layout. A holder is formed with a central platform which carries the single module. At least three legs which are fastened to the baseplate, for example by laser spot welding or soldering, are linked to the platform, preferably via hinges. This known fastening system makes it possible to keep optical components stable to shock and vibration in a wide temperature range.

The prior art discloses the performance of microsoldering using laser beams, the two parts to be joined touching one another, cf. J. L. Jellison et al.: "Microsoldering and microminiature welding with lasers", Microjoining, September 1988, pages 99–107. The testing of solder joints of those connecting surfaces of two components which have been pressed against one another during soldering, at high packing density, is an important problem. For the production of the solder joint, solder beads are produced on the connecting surfaces of a chip component and on the coordinated connecting surfaces of, for example, a substrate or a baseplate. The respective connecting surfaces are brought into contact and heated until the solder material melts, cf. P. A. Burdett et al.: Inspection technique for flip chip bonded devices", Microjoining September 1988, pages 39–45 and 47–50. To round off the prior art, reference is made to Stockham, Microjoining, September 1988, page 27, FIGS. 1 and 2.

It is the object of the present invention to provide a process for joining two parts by soldering which permits extremely accurate positioning.

This object is achieved, according to the invention, by the features of claim 1.

Advantageous developments of the subject of the invention are evident from the subclaims.

The process according to the invention advantageously permits soldering flux-free and accurate solder connection of, in particular, optical, optoelectronic, electronic and miniaturized, mechanical components on a baseplate along six degrees of freedom. In particular, the process according to the invention can advantageously be carried out in a simple manner.

The energy used in the soldering process according to the invention is supplied by energy flows of different types, such as a laser beam, UV irradiation or a magnetic field which is generated by an inductance of high frequency. In all cases, the energy flow passes through the baseplate in order to melt the thin layer of solder material.

Without imposing any restriction, the manner in which the novel soldering process permits optical elements to be fastened on a baseplate with the use of a laser beam is described here. The optical elements are fastened inside a housing whose side to be connected—referred to below as the base—is coated with a solder material, such as tin solder or a tin alloy solder. The baseplate must have good light transmittance within the wavelength range of the laser beams used. That surface of the baseplate which faces the housing is preferably—at least partly—coated with a grid-like metal pattern. The housing to be fastened is held a suitable distance, for example a few tenths of a millimetre, above the baseplate without mechanical contact with the baseplate. If the laser beam is directed upward from below toward the surface of the baseplate, a fraction of its energy heats the metal pattern while the remainder passes through the free areas of the pattern, reaches the base of the housing and causes the solder material present on the base to melt, with the result that a drop of solder material is formed. The drop fills the space between the baseplate and the base of the housing, with the result that a strong and good solder joint is produced after solidification.

The subject of the invention is explained in more detail below on the basis of examples and with reference to the drawings.

The manner in which this novel process can be successfully used for fastening miniaturized optical elements is described here for better comprehension. This technique is particularly suitable for adjusting and fastening microoptical parts along six degrees of freedom with high accuracy. Furthermore, the process, which is free of soldering flux, makes it possible to limit the danger of soiling of sensitive optical elements, such as an exposed laser diode contained in the housing. Any soldering flux present would in fact immediate evaporate with considerable smoke formation if it were reached by the laser beam. Furthermore, a soldering flux technique always requires a cleaning phase in order to prevent possible oxidation of the solder material owing to deposits of soldering flux. In the case of optical elements, this would require particular care.

In the following embodiment of the solder process according to the invention, two separate parts are considered, namely a housing and a baseplate. The housing contains an optical element which is held in its position therein either by adhesive bonding or some mechanical action.

Different materials can be used, but low thermal conductivity should be ensured in order to prevent the optical element from being damaged if the laser beam heats the layer of solder material. High thermal resistance between the housing body and its base makes it possible to reduce the transmitted amount of energy which is necessary for melting the thin layer of solder material, since the heat remains localized in a limited region instead of diffusing into the housing or the total holding means. This property can be achieved either by means of a material which itself has low thermal conductivity or by means of an insulation between the bottom or the base of the housing or a holding means and the remaining part thereof. The thermal resistance can also be geometrically increased by, for example, drilling holes between the body and its base, so that connecting webs having poor heat conduction form.

Figure 1:
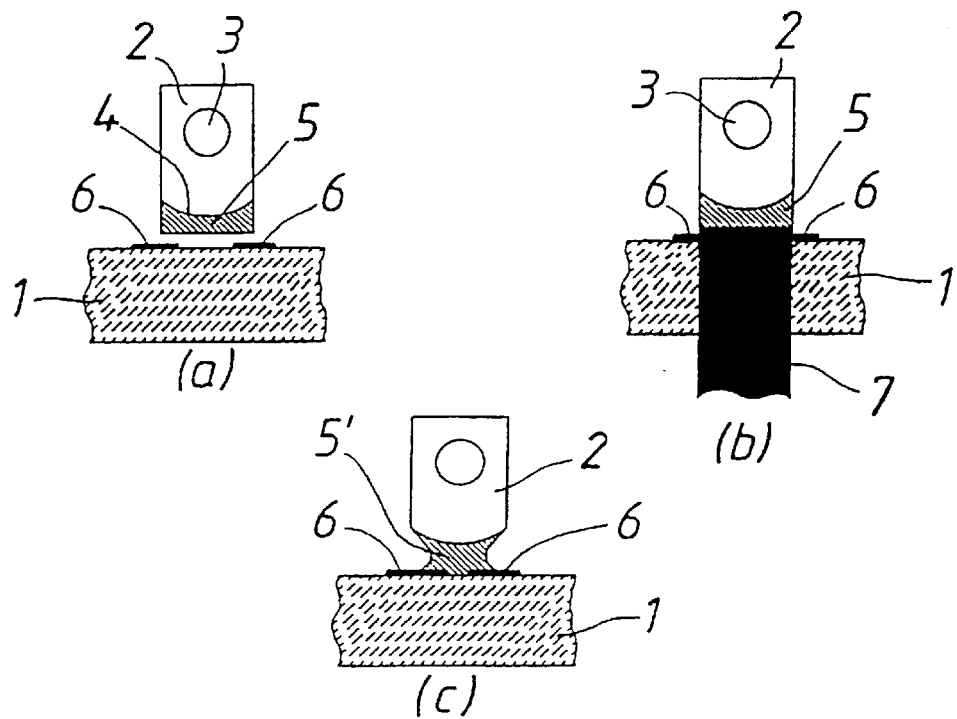
FIGS. 1a–1c show the formation of a drop of solder material.

Below, reference is made to FIGS. 1a–1c and FIG. 2. FIG. 1a shows a baseplate 1 and a housing 2 which is arranged above it and which has a hole 3 for the passage of a light beam. The base 4 of the housing or of the component 2 is formed with a cylindrical surface which is covered by a layer 5 of solder material. The top of the baseplate 1 is partly coated with a thin metal layer 6 in a pattern, resulting in the presence of metal-free regions through which radiant energy can pass.

FIG. 1b additionally shows a laser beam 7 which passes through the baseplate 1 from below said baseplate and strikes the metal layer 6 on the surface of the baseplate 1, and passes through the metal-free regions of the baseplate and strikes the layer 5 of solder material on the base 4 of the housing 2.

FIG. 1b shows the state after local melting of the layer 5 of solder material, a joint with the metal layer 6 of the baseplate 1 being produced by bridging the space between the metal layer 6 and the base 4 of the housing 2.

Figure 2:
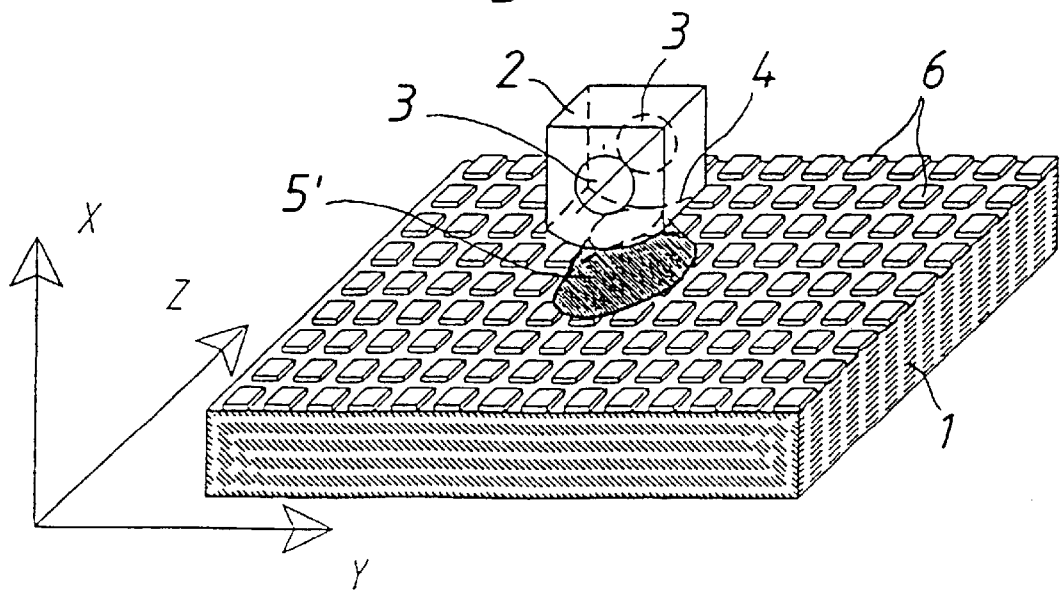
FIG. 2 shows a perspective view of the arrangement of a housing having a cylindrical base surface on a baseplate provided with a pattern.

FIG. 2 shows a perspective view of the arrangement of the housing 2 on the baseplate 1. FIGS. 1a–1c show the metal layer 6 in section, with the result that the extensive design is not evident. It is evident in FIG. 2 that the pattern of the metal layer 6 is formed uniformly by small planar elements. Radiant energy for melting the solder material can pass through between the planar elements. To illustrate the possibilities for rotation before or during the fastening, a Cartesian coordinate system X, Y, Z is shown in FIG. 2.

If the formation of a small liquid drop, for example a few $mm^3$, is considered, the weight of the drop itself can be neglected in comparison with the surface tension. For this reason, the layer of solder material acquires a specific shape, which is to be chosen so that it interacts with the surface tension of the solder material in order to form a thick drop of solder material. The layer of solder material must provide a sufficient volume for filling the space between the housing and the baseplate. In spite of this requirement, the solder material may not prevent the housing from being capable of being adjusted in its spatial position along six degrees of freedom.

A round base was chosen because of the geometrical symmetry during a pitch and roll adjustment. Since rotational symmetry of the solder joint is present between the base of the housing and the baseplate, this permits stable, mechanical connection properties of the solder joint in any configuration, which is important for good repeatability of the process (symmetrical force distribution).

Figure 3:
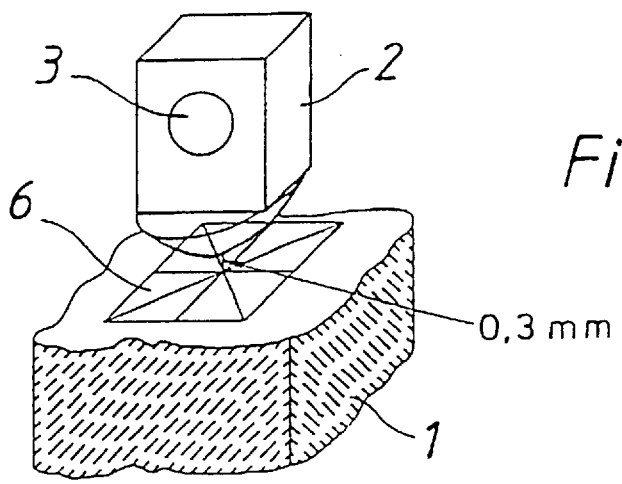
FIG. 3 shows a perspective view of the arrangement of a housing having a spherical base surface on a baseplate provided with a pattern.

A spherical base, as shown in FIG. 3, is the best solution. However, in some technical areas, high angular accuracy of positioning along all three axes is not required, so that the use of a housing which is characterized by a cylindrical base (cf. FIG. 1) may be advantageous since it can be produced easily and at low costs.

The layer of solder material has a low melting point in order to limit the quantity of heat of fusion which is transferred from the laser beam, so that damage to the optical element is prevented. The solder material used must ensure appropriate wettability of the metal pattern with which the baseplate is coated, without the necessity of using any solder material. It is assumed that the solder material will adhere continuously to the baseplate and the holding means. It must also have mechanical properties which ensure a durable, strong joint in order to avoid, for example, a creeping effect during the heat variations or heating periods which occur. The layer of solder material must also have a flat base surface in order to exclude the shadow effect which would influence a round base of solder material if the laser beam were not directed perpendicular to the base itself.

The material which is used for producing the baseplate must in this particular case be characterized by low laser beam absorption. It must also effectively withstand thermal shocks since, if the laser beam is passed through the baseplate, part of the energy carried is absorbed by a local region of the baseplate coating, which region is consequently subjected to a rapid temperature increase. The coating is a material which normally has good conductivity, usually a metal, so that it transmits to the baseplate a certain quantity of energy which causes a local and marked temperature increase. In the case of a baseplate which is suitably characterized by poor thermal conductivity—for example glass, ceramic or glass ceramic, the energy cannot be distributed along the total baseplate and remains concentrated in a local part of the baseplate, which can readily result in the baseplate breaking owing to temperature gradients which are present. Also of importance is the fact that temperature changes can change the mutual spacings of the components and possibly their focal distances, so that it is essential for the material of the baseplate to have a low coefficient of thermal expansion. It is therefore necessary to use a baseplate material which has a high resistance to thermal shocks, such as, for example, Pyrex, Robax or Xerodor.

The baseplate must be suitable for being coated with a thin and noncontinuous metal pattern which is readily wet by molten solder material. The structure of the pattern can be formed by a grid of planar elements or a number of strips which preferably intersect at right angles and form a grid or some other structure which is characterized by uniformly alternating metal regions and free regions. The planar elements may assume a rectangular shape, a square shape, a round shape or any shape which is suitable for being used in this process, which is characterized by technical feasibility.

For example, the basic dimensions of the baseplate provided with a pattern can be the pattern width and the pattern space. In the case of a square pattern with equidistant metal strips of the same width which are at right angles to one another, the sum of the strip width and the strip spacing is defined as the step width. The width of the pattern is the distance between two strips. The opening ratio is the relationship between the square metallized region and the nonmetallized region.

The following is true:

$$\text{Opening ratio} = (\text{Step width} - \text{Width})^2 / \text{Step width}^2.$$

The same applies in the case of a grid arrangement comprising square planar elements.

The metallized pattern regions provide an effective fastening region, while the metal-free regions permit a sufficient quantity of energy to pass through the baseplate in order to melt the solder material. The metallized pattern dimensions and the structure can be freely chosen—according to the technological feasibility and the adherence to a specific opening ratio.

The pattern step width should be at least an order of magnitude smaller than the dimensions of the housing. This ensures a symmetrical and uniform solder joint design between the baseplate and the housing base.

Figure 4:
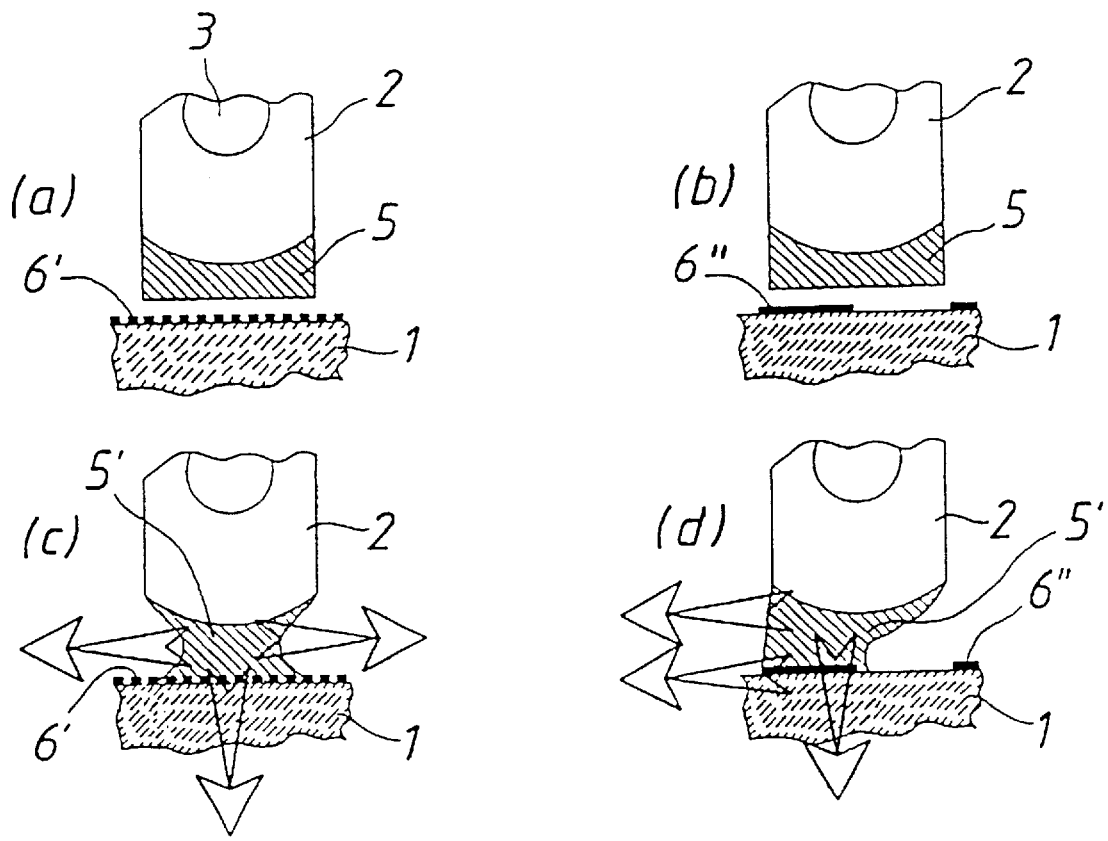
FIGS. 4a–4d show a solder joint using a large-area and a small-area pattern on the baseplate.

In this context, reference is made to FIGS. 4a–4d. In FIGS. 4a and 4c, the baseplate 1 is provided with a fine metal pattern 6'. It can be seen that forces represented by arrows act symmetrically on the molten solder material 5' and lead to an essentially centered solder material joint. In the case of a coarse metal pattern 6", as shown in FIGS. 4b and 4d, the result is an asymmetric force distribution, which leads to an off-center solder joint.

Thus, it is possible to achieve free positioning of the housing on the total surface of the baseplate and to exclude any predetermined geometrical restrictions. Furthermore, the soldering process according to the invention can be carried out in a simple manner.

The metallized pattern is usually formed by a plurality of layers which are distinguished from one another in their thickness and material composition. There are usually three layers, it being the function of the first layer in general to ensure good adhesion to the surface of the baseplate. The second layer, which is generally much thicker than the first layer, represents the substrate material which interacts with the molten solder material in order to implement the fastening. The third layer, which is usually as thin a the first one, provides protection from oxidation by atmospheric oxygen. Since the solder material is always drawn toward, and flows toward, the heated regions, it is very important to heat both parts in order to achieve a strong joint. The novel soldering process described here makes it possible to overcome this problem.

The laser beam is divided on passing through the baseplate: part of the energy passes through the nonmetallized regions of the baseplate while the remaining part is partly absorbed by the metallized regions and partly reflected by them. The quantity of laser energy which passes through the baseplate must be sufficient to melt the layer of solder material on the base of the housing. The light absorbed by the metallized regions of the baseplate may not damage it through overheating. The ratio of reflected to absorbed radiant energy depends on the physical properties of the material of the metal pattern layer.

The opening ratio is determined by the geometrical properties of the pattern (step width, width).

The shape of the laser spot which is used in the soldering process is determined by the dimensions which best suit the housing base, since uniform heating prevents the solder material from producing an asymmetric liquid and strength. It is also possible to use an overdimensioned laser spot which is limited by an aperture. The intensity of the laser spot must be limited because otherwise a part of the solder material can be directly evaporated. Consequently, the duration of heating must be as uniform as possible and should be at least a few seconds. The quantity of energy supplied by the laser beam should not greatly exceed the required heat of fusion, since otherwise an oxide layer is produced on the molten drop of solder material and inevitably impairs the wettability of the solder material.

The laser spot should be adapted, at least in its shape, to the cross-sectional shape of the surface to be irradiated, i.e. the base of the holding means, by moving the laser head or by using mirrors or other optical means for influencing the beam. If the base cross-section of the housing or the holding means is rectangular, one side being twice as long as the other, the shape of the laser beam spot should be not circular but rather elliptical, so that the total base surface is subjected to a smaller energy loss than when covered with a circular laser spot.

When a non-collimated laser beam is used, care must be taken to ensure that the laser spot which is projected onto the metallized surface is not too small. If the spot is too small, there is the danger that the metallized pattern will be damaged by the excessive intensity of the laser spot. If, in contrast, the spot is too large, there is on the other hand the danger that an adjacent and already soldered housing will be damaged or even unsoldered. However, the two abovementioned problems are solved by a collimated laser beam. Furthermore, three-dimensional designs are also possible by arranging two or more baseplates or glass plates provided with a pattern one on top of the other, with mechanical spacers between them. The pattern on each baseplate must be designed in such a way that it is possible for the collimated laser beam to reach the upper baseplate at the appropriate points.

Shrinkage of the solder material during the cooling phase for fastening unavoidably changes the housing adjustment along the vertical axis. The shrinkage exhibits very good repeatability and can be calibrated as a function of the space between the baseplate and the housing base. One solution for overcoming this vertical shrinkage is to automatically compensate it before beginning the soldering process, i.e. for example to take the magnitude of the shrinkage into account in the design.

The lateral accuracy and the angular accuracy are not changed by the shrinkage of the solder material, owing to the spherical or cylindrical symmetry of the housing base and the very fine pattern which is deposited on the baseplate and—compared with the dimension of the housing—is virtually continuous.

The soldering process according to the invention has an accuracy of fastening in the region of 0.1 $\mu$m in all six spatial degrees of freedom and an angular accuracy of 0.1 mrad. The process is particularly suitable for fastening small, optical components, since the level of accuracy along the six degrees of freedom cannot be achieved by other techniques, such as, for example, passive orientation (silicon V-groove).

Active adjustment of the optical element permits an accuracy of positioning of less than 1 $\mu$m. This is achievable since the positioning of each component is effected relative to the optical axis of the preceding component which has already been fastened on the baseplate. Thus, the accuracy of processing of the housing and the accuracy of fastening of each optical component in it are not critical since large mechanical tolerances can readily be compensated during the active assembly of the subsequent component.

The process is suitable in particular for use in automatic assembly stations, since all required functions can be performed by robots which are provided with positioning sensors. Each component is positioned and fixed in the space by a robot, along the six degrees of freedom.

The TREMO SMD technique described here is similar to the known optical SMD technique (DE-A1-195 33 426), which relates to the philosophy of the flexible and active assembly of optical components with high accuracy and along six degrees of freedom. Owing to its miniaturized dimensions, the novel TREMO SMD technique is suitable for use in areas other than the O-SMD technique. The main properties of the TREMO SMD technique are:

it is suitable for three-dimensional designs;
it is suitable for fastening very small optical elements (dimensions of the order of magnitude of 1 mm);
there is no danger of contaminating sensitive optical elements (exposed laser diode) by vapor or particles;
the accuracy of fastening is high (±0.1 $\mu$m);
adjustment of any component—no mechanical contact between the housing base and the baseplate and no mechanical force prior to fastening, no adhesion and slip effect—is possible;
the fastening process can be carried out in general without impairment by the energy supply the—fastening energy is supplied from below the baseplate;
the baseplate has good dimensional stability—glass or ceramic with low linear coefficient of thermal expansion;
a simple housing design and easy miniaturization are possible.

This novel fastening technique can also be used in the case of three-dimensional assembly. For this purpose, the components are arranged on the baseplates which are at different heights, and the high laser beam transmittance is utilized so that the laser beam passes through the various baseplates before the component under consideration is reached on a higher baseplate.

According to the invention, it is in principle also possible to coat the metal pattern layer on the baseplate with a layer of a solder material. As a result of this, the soldering process can be made easier. The energy supply to the metal layer should be implemented appropriately; in particular, it may be necessary to increase the radiation absorption thereof, for example by making the incident side darker.

What is claimed is:

1. A process for fastening a miniaturized component, in particular assembled in a modular manner, on a baseplate by a solder joint, wherein
   (a) coating a side (4) of a component (2) with a layer (5) of solder material;
   (b) coating the baseplate (1) at least partly with a layer of metal (6);
   (c) arranging the component (2) above the baseplate (1), the metal layer (6) and the layer (5) of solder material being a vertical distance apart and not in contact with one another; and
   (d) supplying heat energy from the side of the baseplate (1) for melting the solder material of the layer (5) of solder material on the side (4) of the component until drop formation, with the result that the drop (5') of solder material fills the space between the component (2) and the baseplate (1) for mutual fastening.

2. The process as claimed in claim 1, wherein the metal layer (6) on the baseplate (1) is arranged in a pattern.

3. The process as claimed in claim 2, wherein the pattern of the metal layer is regularly formed.

4. The process as claimed in claim 2, wherein the pattern of the metal layer is irregularly formed.

5. The process as claimed in claim 2, wherein the pattern of the metal layer is in the form of a grid pattern or in the form of a regular pattern of individual planar elements (6).

6. The process as claimed in claim 1, wherein a convex side is used for that side (4) of the component (2) which is coated with solder material.

7. The process as claimed in claim 6, wherein a side curved spherically outward is used for that side (4) of the component (2) which is coated with solder material.

8. The process as claimed in claim 6, wherein a side curved cylindrically outward is used for that side (4) of the component (2) which is coated with solder material.

9. The process as claimed in claim 1, wherein a flat side is used for that side (4) of the component (2) which is coated with solder material.

10. The process as claimed in claim 1, wherein a beam of electromagnetic waves is directed through the baseplate (1) onto the layer (5) of solder material of the component (2) for heating the solder material until it melts.

11. The process as claimed in claim 10, wherein the beam is a laser light beam (7) or UV light beam.

12. The process as claimed in claim 11, wherein an elliptical cross-section is imparted to the beam in the region of incidence.

13. The process as claimed in claim 1, wherein an electrical HF current is allowed to flow through the metal layer of the baseplate (1) for heating the solder material until it melts, with the result that induction heating causes drop formation of solder material on that side (4) of the component (2) which is coated with solder material.

14. The process as claimed in claim 1, wherein the baseplate is produced as a multilayer composite plate.

15. The process as claimed in claim 1, wherein the baseplate (1) is produced from a material transparent to electromagnetic waves.

16. The process as claimed in claim 1, wherein a further component provided with a layer of solder material and to be fastened to a further baseplate is arranged above the further baseplate provided with a metal layer, the metal layer and the layer of solder material being a vertical distance apart and not in contact with one another, and wherein the further baseplate is arranged above the baseplate (1) and a beam of electromagnetic waves is directed through both baseplates onto the layer of solder material of the further component for heating said layer of solder material until it melts, in order to form a drop (5') of solder material for fastening to the further baseplate.

* * * * *